(12) United States Patent
Park

(10) Patent No.: US 7,012,941 B2
(45) Date of Patent: Mar. 14, 2006

(54) LASER MODULE

(75) Inventor: Sung-Soo Park, Suwon-shi (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/446,502

(22) Filed: May 28, 2003

(65) Prior Publication Data

US 2003/0231675 A1    Dec. 18, 2003

(30) Foreign Application Priority Data

Jun. 3, 2002    (KR) .............................. 2002-31177

(51) Int. Cl.
*H01S 3/00* (2006.01)
*H01S 3/13* (2006.01)

(52) U.S. Cl. ................ 372/38.1; 372/29.01; 372/38.02
(58) Field of Classification Search ............ 372/29.01, 372/38.1; 1/38.02
See application file for complete search history.

(56) References Cited

U.S. PATENT DOCUMENTS

| | | | | |
|---|---|---|---|---|
| 4,451,766 A | * | 5/1984 | Angle et al. ................ 315/248 |
| 4,542,535 A | * | 9/1985 | Bates et al. ................ 455/327 |
| 4,553,266 A | * | 11/1985 | Bates et al. ................ 455/327 |
| 4,749,949 A | * | 6/1988 | Albin et al. ................ 327/119 |
| 4,868,675 A | * | 9/1989 | Joosten et al. ............. 358/296 |
| 5,003,253 A | * | 3/1991 | Majidi-Ahy et al. ........ 324/754 |
| 5,210,763 A | * | 5/1993 | Lewis et al. .................. 372/26 |
| 5,343,176 A | * | 8/1994 | Hasler ........................ 333/204 |
| 5,390,337 A | * | 2/1995 | Jelinek et al. .............. 725/128 |
| 5,874,860 A | * | 2/1999 | Brunel et al. ............... 330/285 |
| 5,963,110 A | * | 10/1999 | Ihara et al. .............. 333/28 R |
| 6,011,768 A | * | 1/2000 | Taguchi ..................... 369/116 |
| 6,072,211 A | * | 6/2000 | Miller et al. ................ 257/308 |
| 6,163,222 A | * | 12/2000 | Kobayashi .................. 330/302 |
| 6,225,878 B1 | * | 5/2001 | Takahashi et al. .......... 333/204 |
| 6,307,450 B1 | * | 10/2001 | Takahashi et al. .......... 333/204 |
| 6,329,886 B1 | * | 12/2001 | Ogoro ......................... 333/32 |
| 6,346,859 B1 | * | 2/2002 | Saitou ........................ 330/286 |
| 6,424,223 B1 | * | 7/2002 | Wang et al. ................ 330/286 |
| 6,609,842 B1 | * | 8/2003 | Kimbrough ................. 398/195 |
| 6,628,176 B1 | * | 9/2003 | Okada ......................... 333/32 |
| 6,678,290 B1 | * | 1/2004 | Yoshida et al. ........ 372/29.021 |
| 6,711,190 B1 | * | 3/2004 | Schemmann et al. .... 372/38.02 |

* cited by examiner

*Primary Examiner*—Minsun Oh Harvey
*Assistant Examiner*—Phillip Nguyen
(74) *Attorney, Agent, or Firm*—Cha & Reiter, L.L.C.

(57) ABSTRACT

A laser module for transmitting/receiving digital signals using a laser diode as an optical source is disclosed. The input end of the laser module is provided with a low pass filter, such that the low pass filter makes a 3 dB bandwidth of frequency response transferred from the input pins to the laser diode to be equal or less than the on-state relaxation oscillation frequency of the laser diode, wherein the overshoot is minimized by adjusting a relative amount of the frequency component input to the laser diode.

11 Claims, 4 Drawing Sheets

LASER MODULE

CLIAM OF PRIORITY

This application claims priority to an application entitled "LASER MODULE," filed in the Korean Intellectual Property Office on Jun. 3, 2002 and assigned Serial No. 2002-31177, the contents of which are hereby incorporated by reference.

BACKGROUND OF THE INVENTION

1. Field of the Invention

The present invention relates to a laser module and more particular to a laser module used as a light source for sending/receiving digital signals.

2. Description of the Related Art

A light transmission module is capable of transforming an electrical signal to an optical signal of a desired wavelength through a semiconductor laser. A light reception module is capable of transforming the optical signal to the electrical signal.

In order to transmit digital signals of Non Return to Zero (NRZ), Return to Zero (RZ), etc., a laser diode—such as a 2.5 Gbps Distributed Feedback-Laser Diode (DFB-LD) module or a 10 Gbps DFB-LD module—is used as a light source. In particular, a laser module of a 1.55 um beam wavelength is preferably used for transmitting signals in a long distance away due to the low fiber loss after transmission.

Basic elements constituting the laser module include a laser diode, proper transmission lines for RF-signal, an optical system for collimating the optical signal into fiber. A Monitor Photo Diode (MPD) is also included for monitoring the light output of the laser diode in order to maintain its stability.

The laser diode generates an optical signal in response to an input signal via a lead pin connected to an external integrated circuit, while the MPD detects the average light intensity from the laser diode. The optical system contains lenses to play the role of collimating light. The collimated light is transmitted through the optical fiber, which is attached to the optical system. During operation, an undesirable overshoot of light intensity occurs when the state of laser diode transits from off-state (0-level) to on-state (1-level). This undesirable overshoot is caused by the relaxation oscillation phenomena by the laser diode which can be represented by a relaxation oscillation peak of the frequency response of a laser diode, as shown in FIG. 1. The relaxation oscillation frequency, fr, can be defined by the frequency of maximum response. As the relaxation oscillation frequency, fr, increases when the driving current of the laser diode increases, the fr at on-state (1-level) is larger than the fr at off-state (0-level). Further, as the frequency chirping increases as the intensity overshoot grows, a laser module of a 1.55 um beam wavelength with large overshoot has the problem of shorting the optical transmission distance.

SUMMARY OF THE INVENTION

The present invention overcomes the above-described problem, and provides additional advantages, by providing a laser module having a low pass filter to minimize the overshoot in the optical module in case the laser diode is used as an optical source.

According to one aspect of the invention, a laser module having a low pass filter is provided to increase the transmission distance by reducing the frequency chirping in the laser module of a 1.55 um beam wavelength.

According to another aspect of the invention, there is provided a laser module, which includes a laser diode for generating an optical signal in response to an input electrical signal via a input pins, which is electrically connected to external electronic circuits, and a low pass filter realized on a Co-Planar Waveguide (CPW) for adjusting a relative amount of frequency component from the input pins to the laser diode.

Preferably, the low pass filter enables the 3 dB bandwidth of frequency response transferred from the input pins to the laser diode to be similar to or smaller than the on-state relaxation oscillation frequency of the laser diode.

Still another aspect of the invention is that the present invention may be realized in a simple, reliable, and inexpensive implementation.

BRIEF DESCRIPTION OF THE DRAWINGS

The above features and advantages of the present invention will become more apparent from the following detailed description when taken in conjunction with the accompanying drawings in which.

DETAILED DESCRIPTION OF THE PREFERRED EMBODIMENT

A preferred embodiment of the present invention will be described herein below with reference to the accompanying drawings. For the purposes of clarity and simplicity, well-known functions or constructions are not described in detail as they would obscure the invention in unnecessary detail.

The principle teachings of the present invention is to implement a low-pass filter to an input end of the laser module in order to make the 3 dB-bandwidth frequency response transferred to the laser diode to be similar to or less than the on-state relaxation oscillation frequency of the laser diode, so that the overshoot can be reduced by controlling the relative amount of frequency component at the relaxation oscillation frequency.

Hereinafter, a preferred embodiment of the present invention is described in detail with accompanying drawings of FIG. 2 to FIG. 5.

Figure 1:
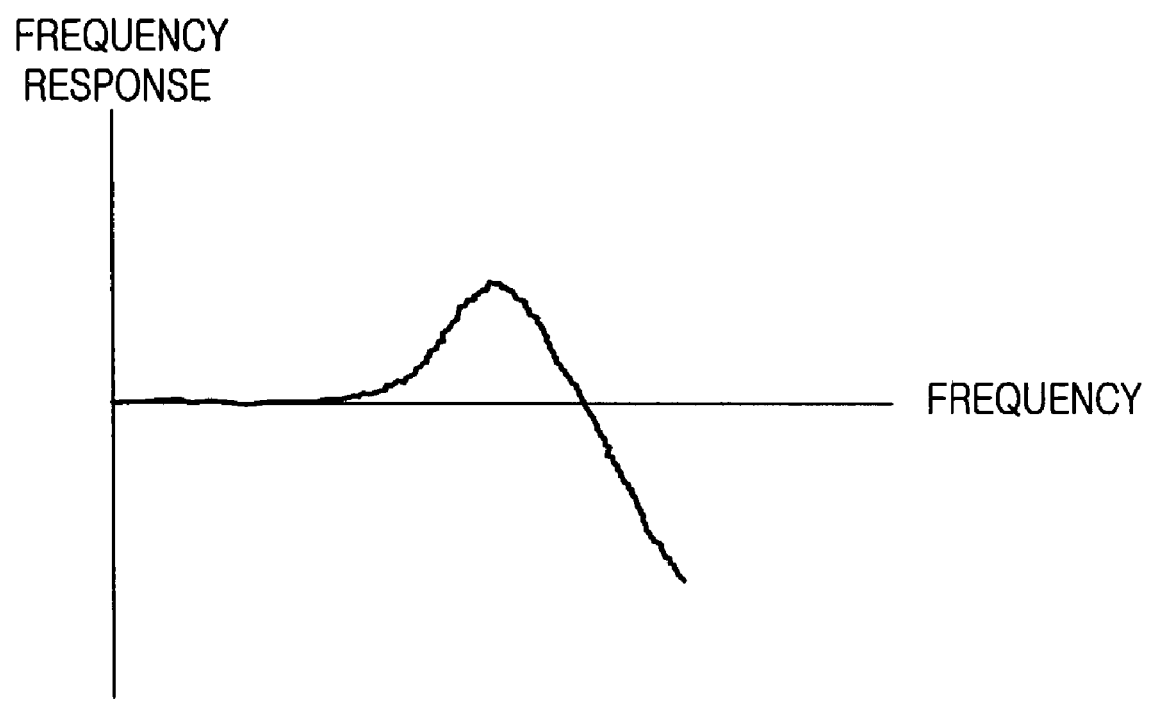
FIG. 1 shows the frequency response characteristic of a laser diode.
Figure 2:
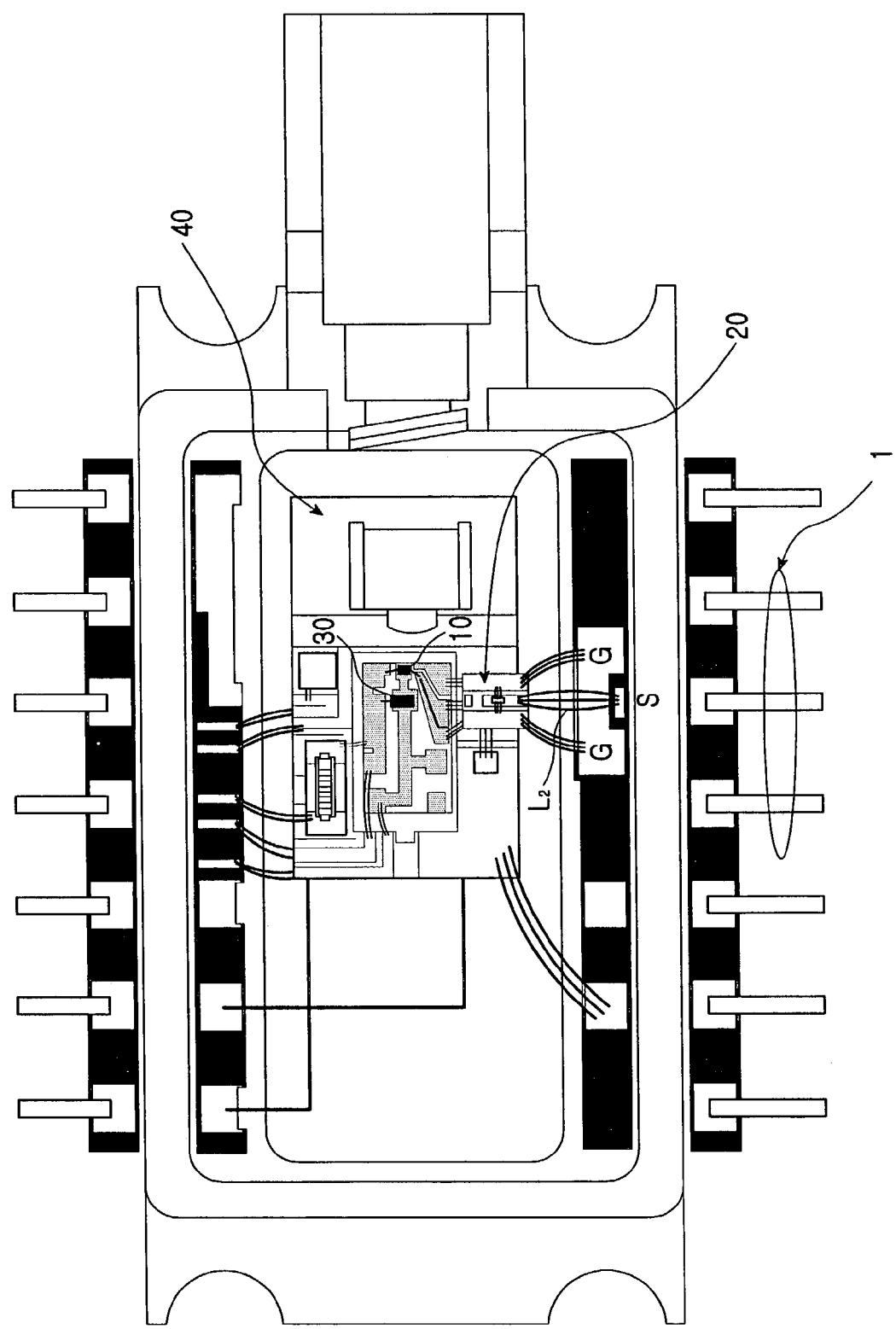
FIG. 2 is an outlined plane diagram showing a laser module according to an embodiment of the present invention.

FIG. 2 is a plane diagram of the laser module according to the embodiment of the present invention. As shown in FIG. 1, the laser module of the present invention comprises a laser diode 10 for generating an optical signal, a Co-Planar Waveguide (CPW) 20 for connecting the external electronic circuits via lead pins 1 and for inputting a signal to the laser diode 10, a monitor photo diode 30 for monitoring the optical output of the laser diode 10 in order to stabilize the signal, and an optical system 40 for collimating light into optical fiber for transferring the optical signal.

Figure 3:
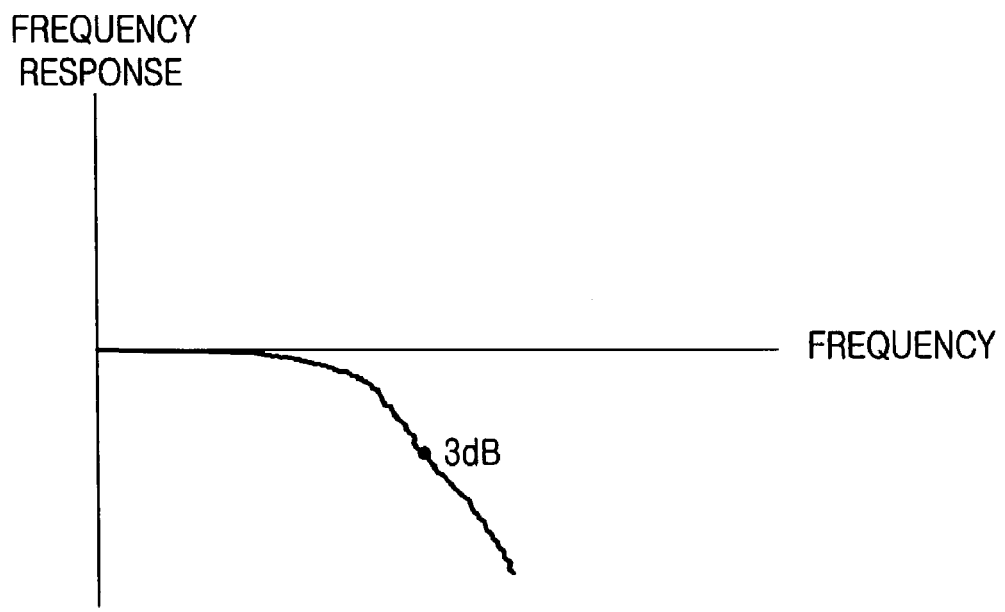
FIG. 3 shows the frequency response characteristic of being transferred to the laser diode after passing a low pass filter according to the present invention.
Figure 4:
FIG. 4 shows the frequency response characteristic of a laser diode module according to the present invention.
Figure 5:
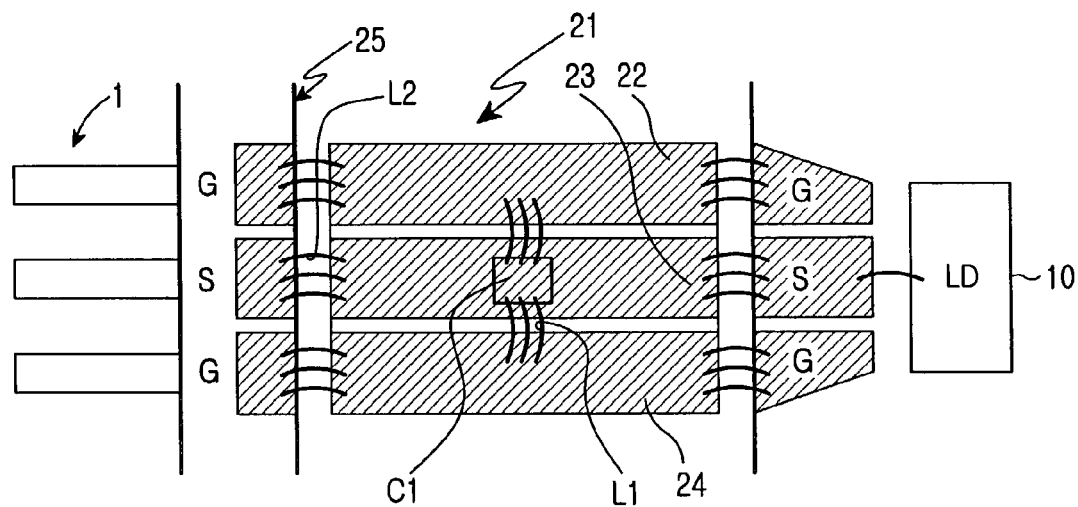
FIG. 5 is a plane diagram showing an embodiment of the low pass filter implemented according to the present invention; and, FIG. 6 is an equivalent circuit diagram of FIG. 5.

As shown in FIG. 5, a low-pass filter 21 can be mounted on CPW 20 for controlling the amount of frequency component input to the laser diode 10. As shown in FIG. 3, the low pass filter is provided to make a 3 dB-bandwidth, transferred to the laser diode 10, to be same or smaller than the relaxation oscillation frequency, fr; of the laser diode 10 when laser diode is turned on. Accordingly, the relaxation oscillation peak in frequency response of the laser module can be relatively reduced, as shown in FIG. 4.

FIG. 5 is a plane diagram showing an embodiment of the low-pass filter 21 implemented in the CPW 20 according to the present invention. As shown in FIG. 5, the low-pass filter is realized using a capacitor C1, which is mounted on the conduction patterns 23, and bonding wires which connect capacitor C1 to the conduction pattern 22 and 24. Reference numbers 1 represents the lead pins, G represents the ground pads, and S represents the signal pad. The bandwidth of the laser module can be adjusted by controlling the capacitance of the capacitor C1, by changing the lengths and the number of the bonding wires, L1 and L2. This controllability comes from the fact that the inductance of bonding wires is proportional to their length and inversely proportional to the number of wires.

Figure 6:
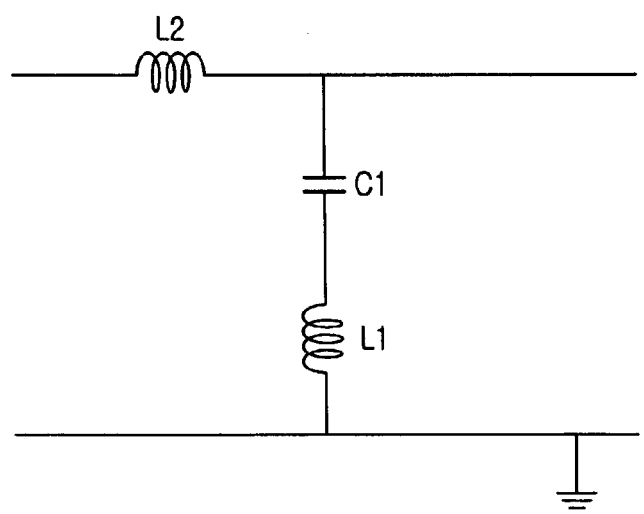

FIG. 6 is an equivalent circuit diagram of the FIG. 5. As shown in FIG. 6, the low pass filter 21 comprises an inductance L2 corresponding to the bonding wires used for connecting the signal pad S with the conduction pattern 23, an capacitor C1, and an inductance L1.

Having thus described a preferred embodiment of a laser module used in an optical communication system, it should be apparent to those skilled in the art that certain advantages of the system have been achieved. In particular, the frequency component corresponding to the on-state relaxation oscillation frequency of the laser diode input to the laser diode can be adjusted by attaching a low pass filter to the input end of the optical module. As a result, an overshoot associated with the prior art can be minimized. In addition, the transmission distance is extended by reducing the frequency chirping in the laser module of 1.55 um beam wavelength as described above.

While the present invention has been shown and described with reference to a certain preferred embodiment thereof, it will be understood by those skilled in the art that various changes in form and details may be made therein without departing from the spirit and scope of the invention as defined by the appended claims and their equivalents.

What is claimed is:

1. A laser diode for generating an optical signal, said laser diode having input ports; and
a low-pass filter mounted on the laser diode for adjusting a relative amount of frequency component from input ports to the laser diode, the low-pass filter further comprising:
a first inductor between signal lines; and
a capacitor and a second inductor connected in series between a signal pattern and a ground pattern;
wherein the low-pass filter is configured to enable a 3 dB bandwidth of frequency response to be transferred from the input ports to the laser diode to be smaller than or substantially equal to an on-state relaxation oscillation frequency of the laser diode module.

2. The laser module according to claim 1, wherein the first and second inductors are bonding wires.

3. The laser module of claim 1, further comprising:
a monitor photo diode for monitoring the output of the laser diode.

4. The laser module of claim 1, further comprising:
an optical device for collimating light into an optical fiber.

5. A laser module comprising:
a laser diode for generating an optical signal, said laser diode having input ports; and
a low-pass filter mounted on the laser diode for adjusting a relative amount of frequency component from input ports to the laser diode, wherein the low-pass filter comprises a capacitor mounted on a plurality conduction pattern elements, and a plurality of bonding wires coupling the capacitor to the plurality of conduction pattern elements;
wherein the low-pass filter is configured to enable a 3 dB bandwidth of frequency response to be transferred from the input ports to the laser diode to be smaller than or substantially equal to an on-state relaxation oscillation frequency of the laser diode module.

6. The laser module of claim 5, wherein the bandwidth of the laser module is selectively adjusted by changing the lengths and the number of the bonding wires coupling the capacitor.

7. A laser module comprising:
a laser diode for generating an optical signal, said laser diode having input ports;
a Co-planar Waveguide (CPW) for coupling a signal from an external electronic circuit to the laser diode; and
a low-pass filter mounted on the CPW for controlling an amount of
frequency component input to the laser diode,
wherein the low-pass filter is configured to enable a 3 dB bandwidth of frecuency transferred to the laser diode to be the same or less than a on-state relaxation oscillation frecuency, fr, of the laser diode module.

8. The laser module of claim 7, further comprising:
a monitor photo diode for monitoring the output of the laser diode.

9. The laser module of claim 7, further comprising:
an optical device for collimating light into an optical fiber.

10. The laser module of claim 7, wherein the low-pass filter comprises a capacitor mounted on a plurality conduction pattern elements, and a plurality of bonding wires coupling the capacitor to the plurality of conduction pattern elements.

11. The laser module of claim 10, wherein the bandwidth of the laser module is selectively adjusted by changing the lengths and the number of the bonding wires coupling the capacitor.

* * * * *